United States Patent [19]

Shimmell

[11] Patent Number: 5,956,500

[45] Date of Patent: *Sep. 21, 1999

[54] METHOD FOR INCORPORATING BOUNDARY CONDITIONS INTO FINITE ELEMENT ANALYSIS

[75] Inventor: Dennis S. Shimmell, Hudsonville, Mich.

[73] Assignee: Nelson Metal Products Corporation, Grandville, Mich.

[ * ] Notice: This patent is subject to a terminal disclaimer.

[21] Appl. No.: 08/866,639

[22] Filed: May 30, 1997

Related U.S. Application Data

[63] Continuation-in-part of application No. 08/735,529, Oct. 23, 1996.

[51] Int. Cl.[6] .................................................. G06F 9/455
[52] U.S. Cl. .............................. 395/500.28; 395/500.27; 395/500.23
[58] Field of Search ............................... 364/578; 73/1.82

[56] References Cited

U.S. PATENT DOCUMENTS

| 5,163,015 | 11/1992 | Yokota | 364/578 |
|---|---|---|---|
| 5,657,588 | 8/1997 | Axon | 52/167.1 |
| 5,677,857 | 10/1997 | Hayashi et al. | 364/578 |

OTHER PUBLICATIONS

Shock and Vibration Handbook, ISBN 0-07-026920-3, Harris (Editor), Pyroshock Testing, Chapter 26, Part II, pp. 26.27–26.32, 1996.

"Algor Software Enables Engineers to Re-design Pipe Shoes," published in "Algor Design World," http://algor.com/adw/july96/pipeshoe.htm, Jul. 1996.

*Primary Examiner*—Kevin J. Teska
*Assistant Examiner*—Samuel Broda
*Attorney, Agent, or Firm*—Warner Norcross & Judd LLP

[57] ABSTRACT

A method for conducting finite element analysis of a component which takes into consideration the apparent rigidity of an interface structure. The method generally includes the steps of (a) providing a standard shim bar, (b) physically measuring the natural frequencies of the standard shim bar when mounted to the interface structure in at least two orientations, (c) generating a finite element model having a shim interposed between the component and ground, (d) selecting the characteristics of the shim as a function of the measured natural frequencies of the standard test bar in both the first and second orientations, and (e) once the appropriate characteristics are selected, performing the desired finite element analysis on the finite element model. In one embodiment, the characteristics of the shim can be determined by (a) generating a finite element test bar that is a finite element reduction of the standard test bar, (b) interposing a finite element shim between the finite element test bar and ground, and (c) selecting the characteristics of the shim such that tested characteristics of the finite element test bar correlate with the measured characteristics of the standard test bar.

30 Claims, 10 Drawing Sheets

| SHIM MODULUS E[X 1E6 psi.] 1,000,000 psi. | MEASURED FIRST NATURAL FREQUENCY [Hz] | MEASURED SECOND NATURAL FREQUENCY [Hz] |
|---|---|---|
| 1.0 | 231.47 | 235.29 |
| 1.5 | 249.42 | 255.06 |
| 2.0 | 263.47 | 270.88 |
| 2.5 | 274.86 | 283.94 |
| 3.0 | 284.31 | 294.97 |
| 3.5 | 292.31 | 304.44 |
| 4.0 | 299.18 | 312.67 |
| 4.5 | 305.16 | 319.91 |
| 5.0 | 310.40 | 326.34 |
| 5.5 | 315.05 | 332.09 |
| 6.0 | 319.21 | 337.26 |
| 6.5 | 322.94 | 341.95 |
| 7.0 | 326.32 | 346.22 |
| 7.5 | 329.39 | 350.13 |
| 8.0 | 332.20 | 353.72 |
| 8.5 | 334.78 | 357.03 |
| 9.0 | 337.15 | 360.09 |
| 9.5 | 339.35 | 362.94 |
| 10.0 | 341.38 | 365.59 |
| 10.5 | 343.28 | 368.06 |
| 11.0 | 345.04 | 370.38 |
| 11.5 | 346.70 | 372.56 |
| 12.0 | 348.25 | 374.60 |
| 12.5 | 349.70 | 376.53 |
| 13.0 | 351.07 | 378.35 |
| 13.5 | 352.37 | 380.07 |
| 14.0 | 353.59 | 381.70 |
| 14.5 | 354.75 | 383.24 |
| 15.0 | 355.84 | 384.71 |
| 15.5 | 356.89 | 386.11 |
| 16.0 | 357.88 | 387.44 |
| 16.5 | 358.82 | 388.72 |
| 17.0 | 359.72 | 389.93 |
| 17.5 | 360.58 | 391.09 |
| 18.0 | 361.40 | 392.20 |
| 18.5 | 362.19 | 393.27 |
| 19.0 | 362.94 | 394.29 |
| 19.5 | 363.67 | 395.27 |
| 20.0 | 364.36 | 396.21 |

FIG. 13A

| SHIM MODULUS E[X 1E6 psi.] 1,000,000 psi. | MEASURED FIRST NATURAL FREQUENCY [Hz] | MEASURED SECOND NATURAL FREQUENCY [Hz] |
| --- | --- | --- |
| 20.5 | 365.02 | 397.12 |
| 21.0 | 365.66 | 397.99 |
| 21.5 | 366.28 | 398.83 |
| 22.0 | 366.87 | 399.64 |
| 22.5 | 367.44 | 400.42 |
| 23.0 | 368.00 | 401.17 |
| 23.5 | 368.53 | 401.90 |
| 24.0 | 369.04 | 402.60 |
| 24.5 | 369.54 | 403.29 |
| 25.0 | 370.02 | 403.94 |
| 25.5 | 370.48 | 404.58 |
| 26.0 | 370.93 | 405.20 |
| 26.5 | 371.37 | 405.80 |
| 27.0 | 371.79 | 406.38 |
| 27.5 | 372.20 | 406.94 |
| 28.0 | 372.60 | 407.49 |
| 28.5 | 372.98 | 408.02 |
| 29.0 | 373.36 | 408.54 |
| 29.5 | 373.72 | 409.04 |
| 30.0 | 374.07 | 409.53 |

FIG. 13B

METHOD FOR INCORPORATING BOUNDARY CONDITIONS INTO FINITE ELEMENT ANALYSIS

This application is a continuation-in-part of U.S. application Ser. No. 08/735,529 filed Oct. 23, 1996.

BACKGROUND OF THE INVENTION

The present invention relates to numerical techniques for modeling and solving complex system equations through the use of a finite element model and more particularly to a method for incorporating boundary conditions into a finite element model.

Finite element analysis is a computerized method widely used in industry to model and solve engineering problems relating to complex systems. A finite element model is generating by reducing the system, or domain, into a number of discretized units typically referred to as finite elements. Once reduced, the domain can be represented by a system of equations that are solved, typically by computer, to predict the response of the domain to various external influences. Finite element analysis is used in a variety of applications including solid mechanics, fluid mechanics, biomechanics, heat transfer, geomechanics, aeromechanics, coupled systems, chemical reactions, acoustics, and electric and magnetic fields.

Perhaps the most common use of finite element analysis is in the field of solid mechanics where it is used to analyze structural problems. Finite element analysis software adapted for use with solid mechanics is available from a wide variety of commercial suppliers. Finite element analysis begins by using finite element software to generating a finite element model of the system. In this model, the component is reduced into a number of finite elements. The finite element reduction is fixed to "ground" at more or more locations to simulate attachment of the component to an interface structure. In the finite element model, "ground" represents a perfectly rigid structure that will not flex or move under a load. A simulated load or other influence is applied to the system and the resulting effect is analyzed using conventional mathematical methodologies. This method is well suited when the designed component is to interface with a structure that is, like ground, perfectly rigid. In many applications, however, the structure with which the component is to interface will not have such characteristics. This poses a significant problem because the rigidity of the interface structure affects the natural frequencies of any components attached thereto. For example, automobile engine mounting bosses do not have the same rigidity characteristics as ground. Therefore, engine brackets and similar components will exhibit different natural frequencies when mounted to the engine than when modeled using conventional finite element analysis.

One method for addressing this problem is to design the component using conventional finite element analysis, manufacture a prototype based on this design, and then physically determine the natural frequencies of the prototype attached to the interface structure (i.e. the engine). Once the actual natural frequencies are determined, the boundary conditions of the finite element model are adjusted using a trial and error method until an acceptable correlation with the measured frequencies is achieved. This process is extremely time consuming and CPU intensive because it requires the design and testing of an initial prototype as well as repeated adjustment and resolution of the system equations.

SUMMARY OF THE INVENTION

The aforementioned problems are overcome by the present invention wherein a method is provided for conducting finite element analysis of a component which takes into account the apparent rigidity of any interface structures. The method includes the steps of (a) determining the natural frequencies of a standard test bar attached to the interface structure; (b) generating, in a computer, a finite element shim as a function of the measured natural frequencies; (c) generating, in a computer, a finite element model having the shim interposed between the component and ground; and (d) performing, in a computer, the desired finite element analysis on the finite element model.

In the most preferred embodiment, the natural frequencies of the standard test bar are determined by mounting the bar to the interface structure and applying conventional physical testing methods. Typically, the test bar is attached to the interface structure using a conventional fastener, such as a bolt. It has been determined that variations in the amount of torque applied to the fastener can alter the measured natural frequencies of the test bar. Accordingly, the fastener preferably is applied with a standard torque. It has also been determined that the measured natural frequencies of the test bar can vary as a result of variations in directional stiffness of the interface structure. Therefore, the natural frequencies of the test bar can be measured at various orientations with respect to the interface structure.

The finite element model is generated in a computer consisting of a finite element shim interposed between a finite element test bar (generated as a finite element reduction of the standard test bar) and ground. The modulus of elasticity of the finite element shim is adjusted until the computed natural frequencies of the finite element test bar correlate with the measured natural frequencies of the test bar attached to the interface structure. Once the appropriate modulus of elasticity is determined, the shim is imported into a finite element model of the component where it is interposed between the component and ground. For applications in which directional stiffness has been measured, the finite element shim is modeled to represent the measured variations. This is done by providing the finite element shim with a different modulus of elasticity in different directions or by distorting the shape of the shim to emulate the variations in stiffness. The finite element model can then be solved by the computer using conventional techniques.

The present invention provides a simple and effective method for communicating the effect of an interface structure on the natural frequencies of a component and also for incorporating those effects into a finite element model of the system. The present invention eliminates the need for duplicate and wasteful trial and error engineering, dramatically reducing labor and CPU processing time. Further, the present invention incorporates a standard level of bolt torque and permits consideration of directional stiffness of the interface structure, thereby improving the accuracy of the method.

These and other objects, advantages, and features of the invention will be readily understood and appreciated by reference to the detailed description of the preferred embodiment and the drawings.

BRIEF DESCRIPTION OF THE DRAWINGS

FIG. 13a is the first portion of a chart showing the shim modulus for a variety of measured frequencies;

FIG. 13b is the second portion of a chart showing the shim modulus for a variety of measured frequencies.

DETAILED DESCRIPTION OF THE PREFERRED EMBODIMENT

Figure 11:
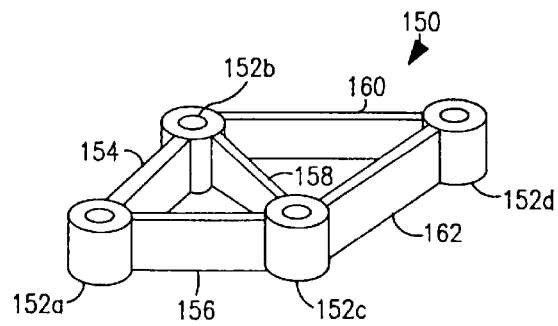
FIG. 11 is a perspective view of the engine bracket.
Figure 12:
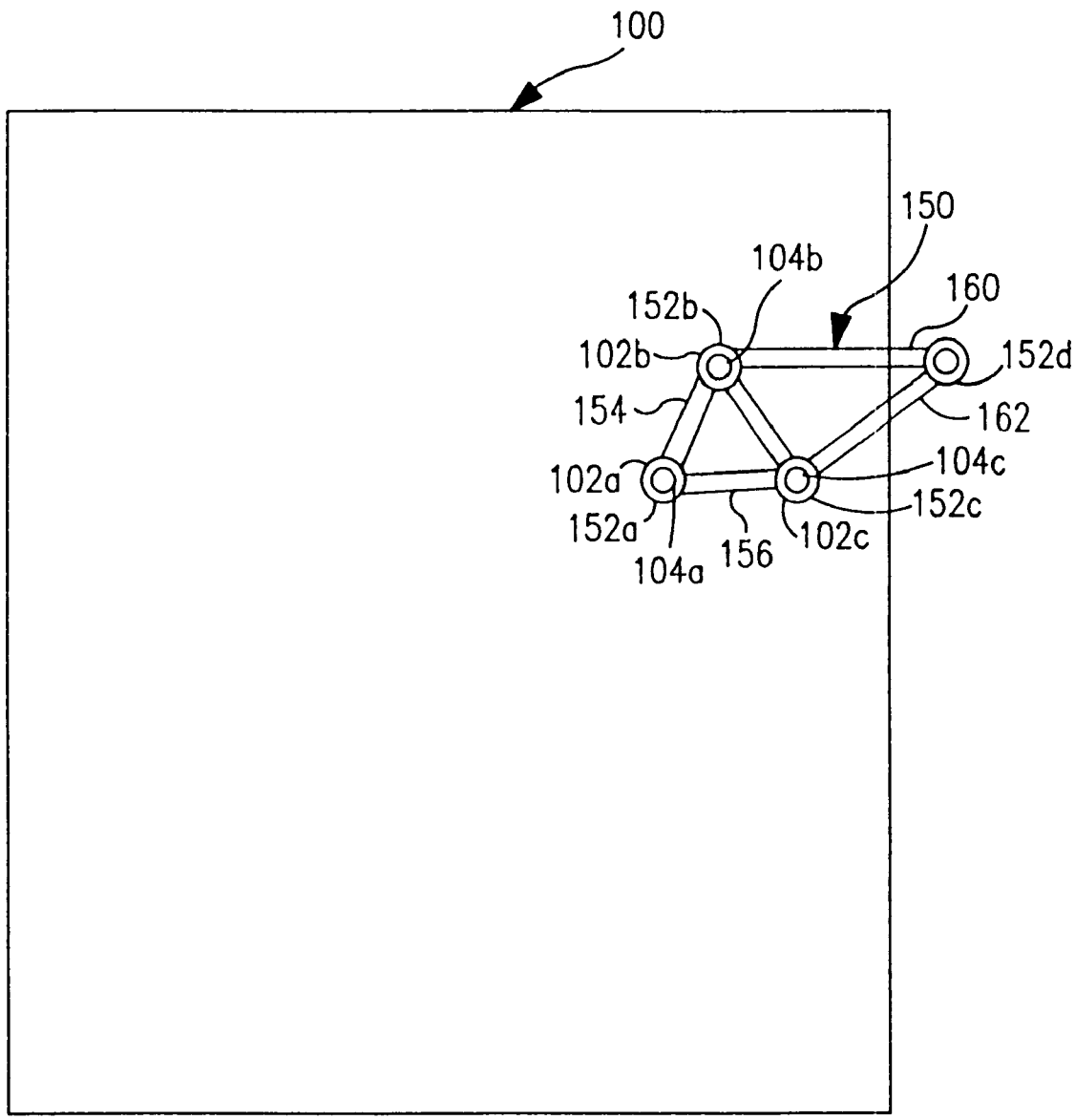
FIG. 12 is a side elevational view of the engine bracket mounted to a block representation of the engine.

In a preferred embodiment, the present invention provides a method for designing a component using finite element analysis (FEA) in which the finite element model incorporates certain boundary conditions which affect the natural frequencies of the component. The finite element model is generated and analyzed using conventional finite element analysis (FEA) software on a conventional computer system. For purposes of disclosure, and not by way of limitation, the present invention is described in connection with the design of an engine bracket 150 adapted to mount to engine 100. As shown in FIGS. 11 and 12, the engine bracket 150 includes a plurality of mounting bosses 152a–d interconnected by ribs 154, 156, 158, 160, and 162. Bosses 152a–c are adapted to mount to the engine (represented in FIG. 12 by block 100) at mounting locations 102a–c using conventional bolts 104a–c. Boss 152d is adapted to support an article such as an alternator (not shown).

Figure 1:
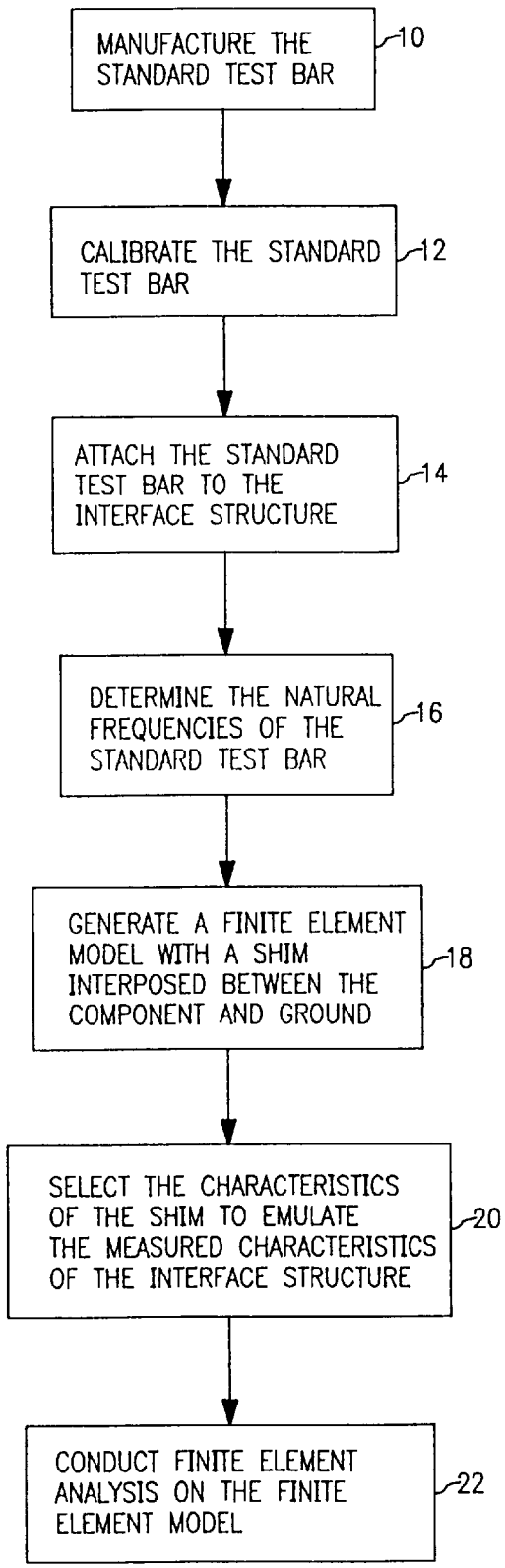
FIG. 1 is schematic diagram of the primary steps of the present invention.

FIG. 1 shows the primary steps involved in the present method. In general, the method includes manufacturing 10 a standard test bar 130 that is used to determine the apparent rigidity of the interface structure at each mounting location—in this case, engine 100 at mounting locations 102a-c. The standard test bar 130 is then calibrated 12 by generating a finite element model 130' of the test bar using conventional FEA software, and, as described in more detail below, selecting the characteristics of the finite element model 130' to correlate with the standard test bar 130. The calibrated standard test bar is then attached 14 to the interface structure at a mounting location and its natural frequencies are determined 16 using conventional physical methods. A finite element model 150' of the component 150 is then generated 18 using conventional FEA software with a shim 140' interposed 20 between the component 150' and ground (not shown). As described in more detail below, the characteristics of the shim 140' are selected 20 as a function of the measured natural frequencies. The finite element model 150' can then be solved 22 using conventional finite element methodologies.

Figure 3:
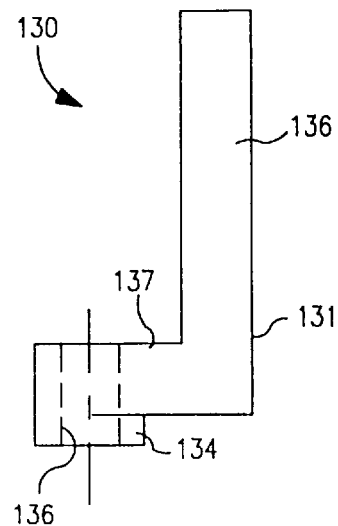
FIG. 3 is a side elevational view of the standard test bar.
Figure 2:
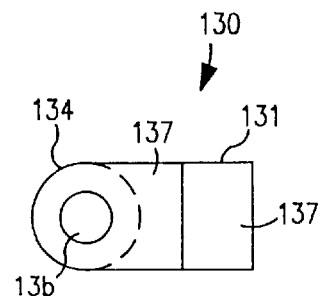
FIG. 2 is top plan view of the standard test bar.

Referring now to FIGS. 2 and 3, the standard test bar 130 includes an L-shaped leg 131 having a vertical portion 136, a horizontal portion 137, and a downwardly extending cylindrical neck 134. The vertical portion 136 extends parallel to the axis of the neck 134. The test bar 130 defines a bore 136 through the horizontal portion 137 and the neck 134 in axial alignment with the neck 134. The bore 136 functions as a boss for attaching the test bar 130 to an interface structure, such as engine 100, using conventional fasteners 102 (See FIG. 7). As the natural frequencies increases, they can become more difficult to discern using conventional physical techniques. Accordingly, the geometry of the test bar 130 is selected such that the first natural frequency is easily discernible when the test bar 130 is mounted to the interface structure and the bed plate. For example, the geometry may be selected so that the first natural frequency of the test bar 130 is approximately 800 HZ when mounted to a bed plate. It should be noted that the natural frequencies of the test bar 130 may vary depending on the material used to manufacture the bed plate (e.g. steel or aluminum). The design of the standard test bar 130 may vary from application to application depending on the construction of the interface structure and the size and type of mounting apparatus used to secure the component to the interface structure.

Figure 5:
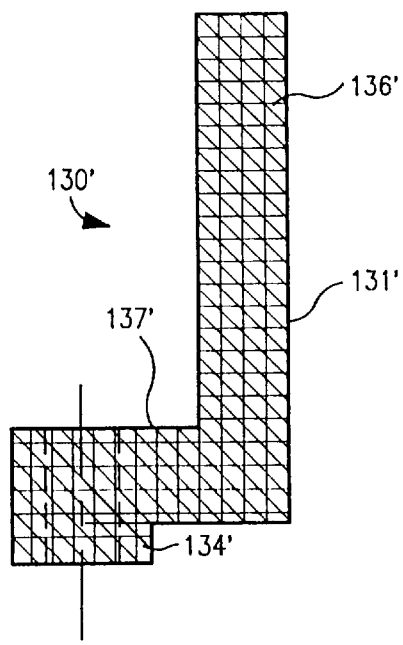
FIG. 5 is a side elevational view of the finite element model of the standard test bar.
Figure 4:
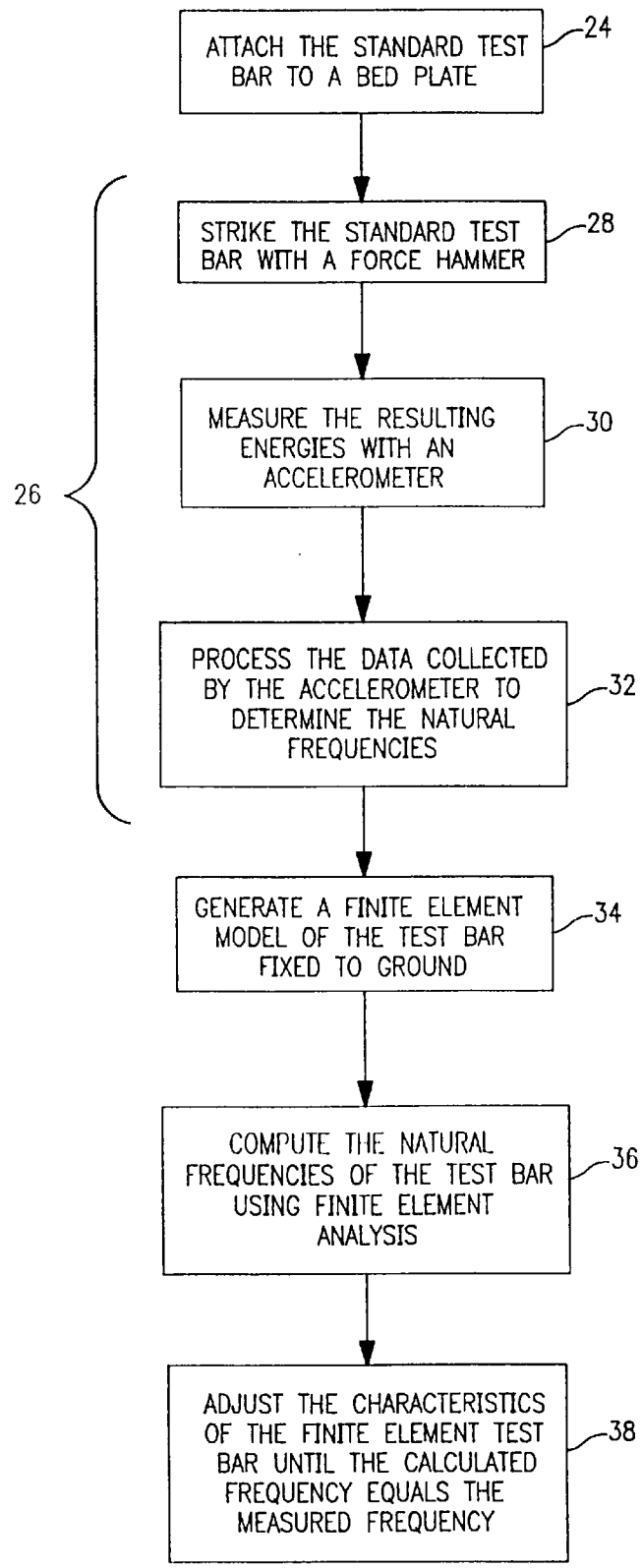
FIG. 4 is a schematic diagram of the primary steps of the standard test bar calibration process.

The standard test bar 130 is calibrated with a finite element representation of the test bar 130' so that FEA can be used to determine the appropriate characteristics of the shim 140'. The calibration process for the standard test bar 130 is described with reference to FIG. 4. First, the standard test bar 130 is attached 24 to a conventional bed plate (not shown). The standard test bar 130 is attached to the bed plate by a conventional fastener (not shown), such as an M-10 bolt, with a standard applied force or torque, such as 40 newton-meters. The natural frequencies of the test bar 130 are then determined 26 using conventional physical techniques. In the most preferred embodiment, the standard test bar 130 is struck 28 by a conventional force hammer (not shown) and the resulting energies are measured 30 by an accelerometer (not shown). The data collected by the accelerometer is then processed 32 using fast Fourier transform (FFT) methodologies to determine the natural frequencies. Second, a finite element model 130' of the standard test bar is generated 34 using conventional FEA software. The neck 134' of the finite element test bar 130' fixed directly to ground (See FIG. 5). The natural frequencies of the finite element test bar 130' are computed 36 using conventional FEA techniques. The characteristics of the finite element bar 130', such as the modulus of elasticity and the density, and/or the finite element analysis node connections are adjusted 38 as necessary to bring the FEA computed frequencies into correlation with the measured frequencies. When these frequencies match with reasonable accuracy, the standard test bar 130 is calibrated with the finite element test bar 130'.

Figure 7:
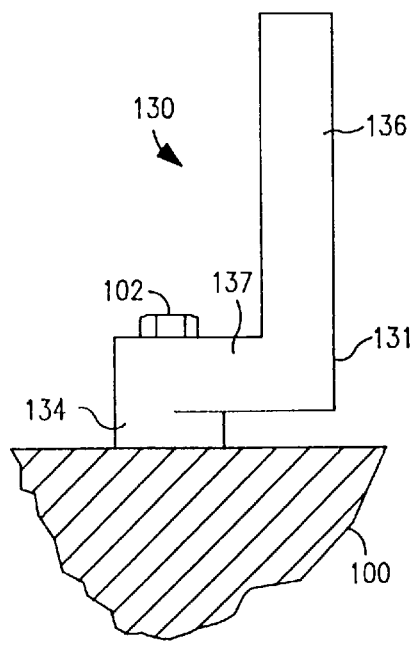
FIG. 7 is a partially sectional side elevational view of the standard test bar mounted to an engine.
Figure 6:
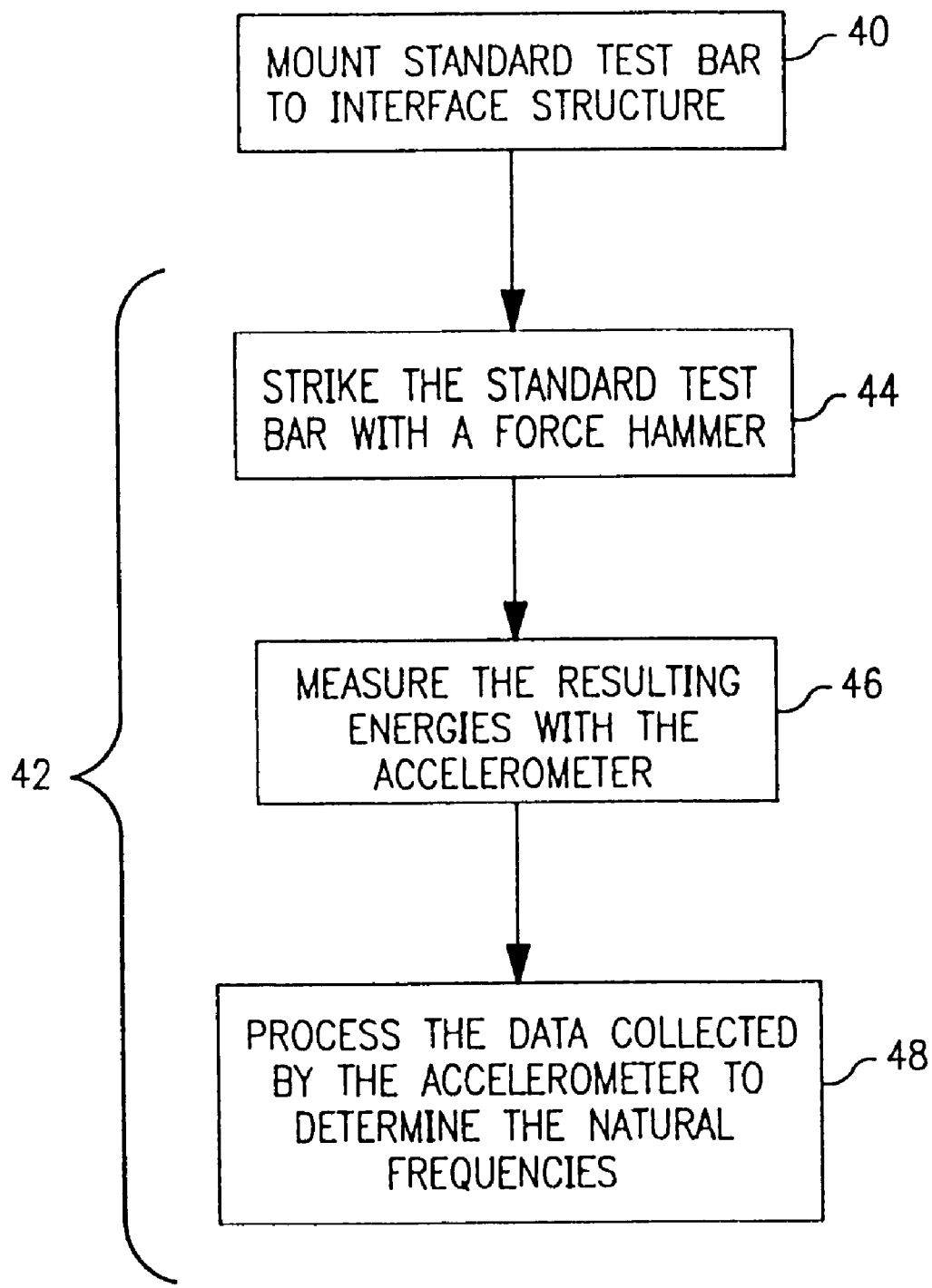
FIG. 6 is a schematic diagram of the primary steps of the interface structure measuring process.
Figure 14:
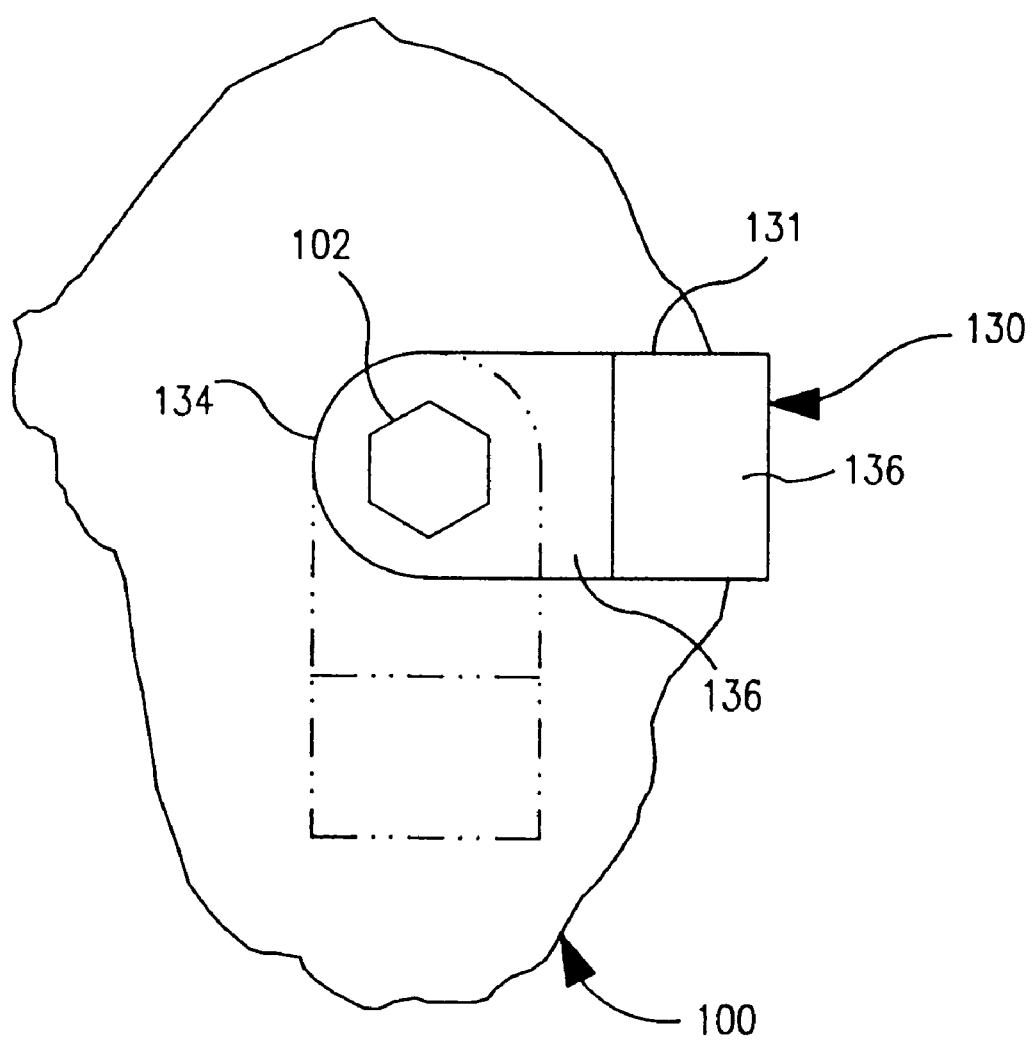
FIG. 14 is a top plan view showing the standard test bar mounted to the engine.

The standard test bar 130 is used to measure the rigidity characteristics of an interface structure, such as engine 100, so that those characteristics can be incorporated into the finite element model. The measuring process is described with reference to FIG. 6. As illustrated in FIG. 7, the standard test bar 30 is mounted 40 to the engine 100 at one of the mounting locations using a conventional fastener, such as bolt 102. Preferably, the bolt 102 will be the same type of bolt used to attach the standard test bar 30 to the bed plate (not shown) (i.e. a conventional M-10 bolt). In addition, the bolt is tightened to the standard torque which, as noted above, is 40 newton-meters. The natural frequencies of the standard test bar 30 are then determined 42 using conventional physical testing methodologies. In the most preferred embodiment, the standard test bar 130 is struck 44 by a conventional force hammer (not shown) and the resulting energies are measured 46 by an accelerometer (not shown). The data collected by the accelerometer is then processed 48 using FFT methodologies to determine the test bar's 130 natural frequencies. To account for variations in the directional stiffness of the mounting boss, the natural frequencies of the standard test bar can be separately measured and computed with the test bar mounted to the boss in two or more different orientations. For example, the natural frequencies can be measured and computed a first time with the test bar mounted to the boss in a first orientation, then the test bar can be rotated ninety degrees about the mounting boss and the natural frequencies can be measured and computed for a second time. FIG. 14 shows the standard test bar 130 mounted to the engine in the first orientation in solid lines and in the second orientation in phantom lines. The measuring process is repeated for each mounting location 102a–c.

If the frequencies of the test bar 130 attached to the engine 100 are approximately equal to the frequencies of the test bar 130 attached to the bed plate (not shown), then the apparent rigidity of the engine 100 at that mounting location is approximately equal to ground and the finite element model can be generated with the component fixed directly to ground at that location. If, however, as will typically be the case, the frequencies are not approximately equal, the finite element model of the component is generated with a shim interposed between the component and ground at that mounting location. The modulus of elasticity of the shim, or shim modulus, is selected so that the apparent rigidity of the shim matches that of the engine 100 at any given mounting location.

Figure 8:
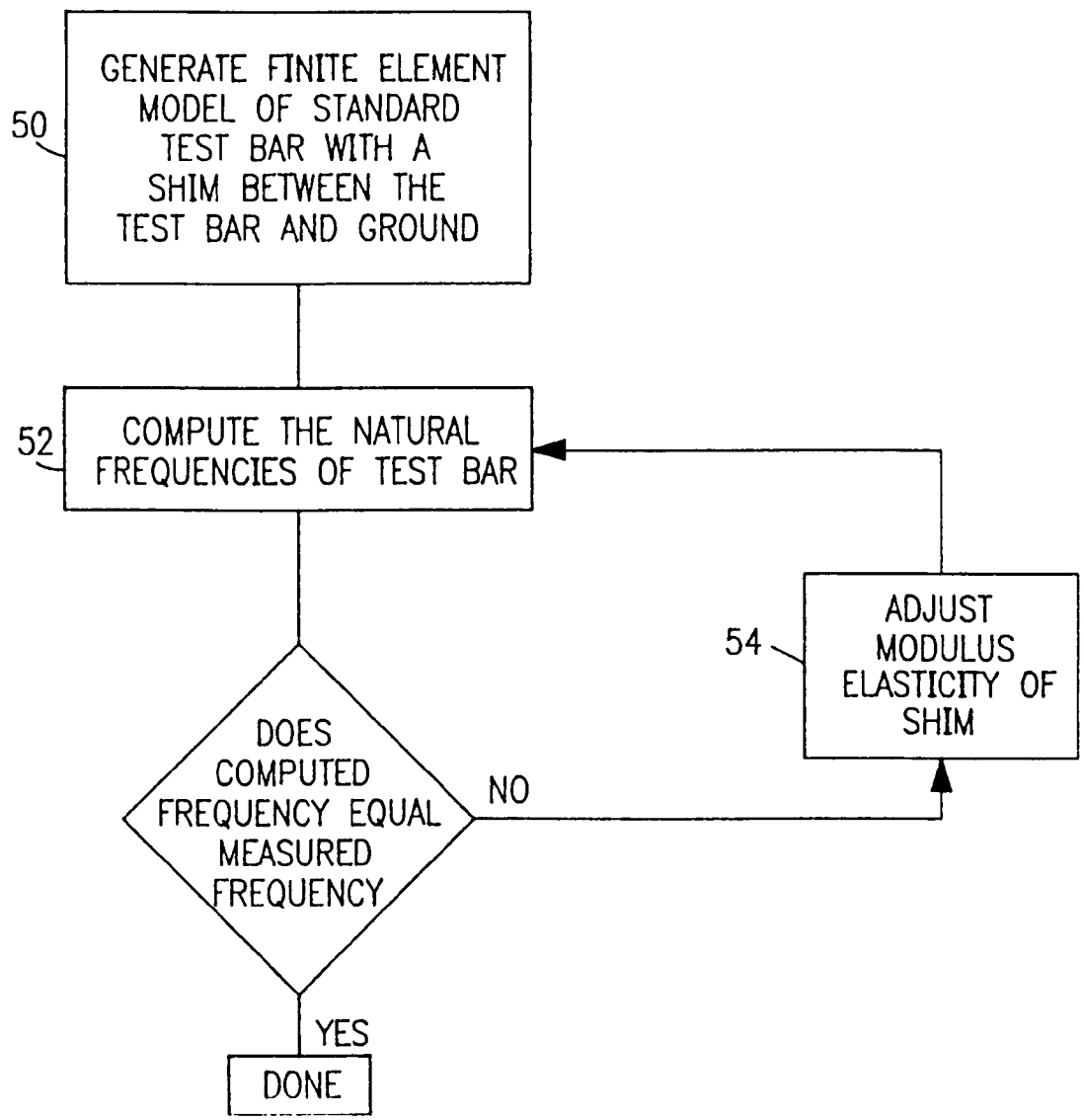
FIG. 8 is a schematic diagram of the primary steps of the shim modulus calculation process.
Figure 9:
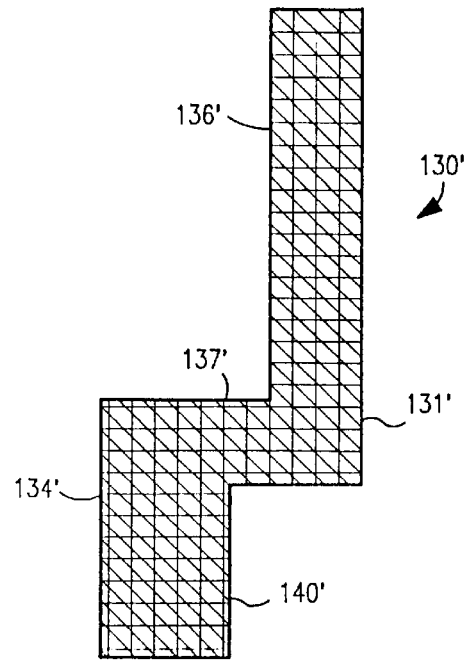
FIG. 9 is a side elevational view of the finite element model of the standard test bar and shim.

The shim modulus calculation process is described in more detail with reference to the schematic diagram shown in FIG. 8. In this process, a finite element model is generated using conventional FEA software with a shim 140' interposed between the calibrated finite element test bar 130' and ground (See FIG. 9). The shim includes standard dimensions that are largely arbitrary. In the most preferred embodiment, however, the shim is a tubular segment having an external diameter of 24 mm, a length of 30 mm, and a bore diameter of 8 mm. By adjusting the modulus of elasticity of the shim 140', its rigidity and consequently the natural frequencies of the finite element test bar 130' are varied. The shim modulus is determined by computing 52 the natural frequencies of the finite element test bar 130' and comparing the computed FEA frequencies with the measured frequencies for that mounting location. If the frequencies do not match, the modulus of elasticity of the shim is adjusted 54 and the natural frequencies are recomputed. The process is repeated until the FEA computed frequencies match the measured frequencies for that mounting location. For components having multiple mounting locations, the shim modulus is separately determined for each location. Alternatively, a chart can be generated for each standard test bar showing the appropriate shim modulus for any measured natural frequencies. Such a chart will eliminate the need to return to the finite element model of the test bar 130' to calculate the shim moduli for each mounting location. An example look-up chart is shown in FIGS. 13a–b. This look-up chart shows the approximate shim moduli for a test bar having a first natural frequency of 400 Hz when mounted to a steel bed plate and a shim having an external diameter of 24 mm, a bore diameter of 8 mm, and a length of 30 mm. If there are any variations in the test bar or in the shim, a custom shim modulus chart must be generated. The appropriate shim modulus is determined by looking up the measured first natural frequency or second natural frequency in columns 2 or 3. Once the row containing the appropriate measured frequency is found, the shim modulus is provided in column 1.

In applications where directional stiffness of the mounting boss is to be considered, the shim 140' generation process is altered somewhat. Many conventional finite element analysis software packages permit an element to be modeled with different moduli of elasticity in different directions. Accordingly, it is possible to model the shim 140' with a different modulus of elasticity in each of the measured directions. With such packages, the shim 140' is modeled by repeating the above described determination process for each direction. In an application involving two measured directions, the correct shim moduli will be determined when the computed natural frequencies of the finite element test bar 130' match the measured natural frequencies of the standard test bar in both directions. Alternatively, directional stiffness can be simulated by distorting the shape of the finite element shim 140'. For example, the shim 140' can be modeled with an elliptical shape rather than a circular shape to provide additional stiffness along the direction defined by the major chord of the ellipse. This method is particularly useful in connection with software packages that do not permit an element to be modeled with different moduli of elasticity.

Figure 10:
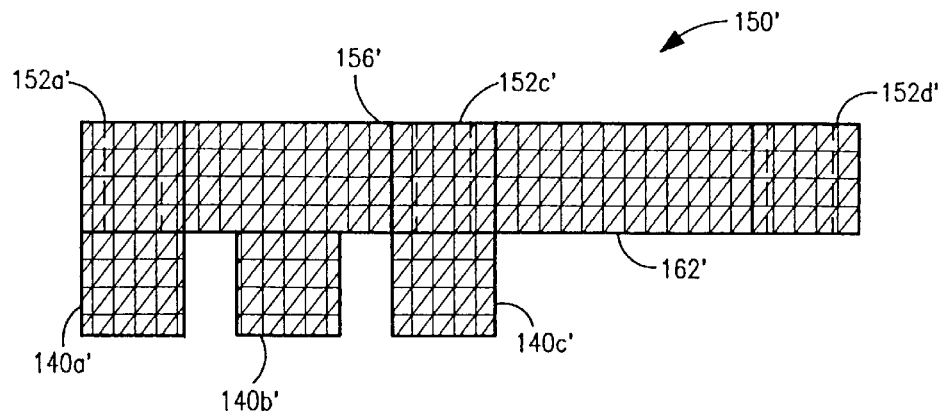
FIG. 10 is a side elevational view of the finite element model of the engine bracket and shims.

Once the appropriate shim modulus(es) is determined, a finite element model of the component is generated using conventional FEA software. This finite element model includes a shim 140a–c' interposed between the component 150' and ground at each mounting location (See FIG. 10). Each of these shims 140a–c' is modeled with a modulus of elasticity that corresponds with the calculated shim modulus for that mounting location. In applications involving directional stiffness, the shims 140a–c' are modeled with the determined moduli of elasticity along the appropriate directions or the shape of the shim is altered to simulate the variation in directional stiffness (e.g. by making it elliptical in shape). Accordingly, the shims 140a–c' provide the finite element model with the approximate rigidity characteristics of the interface structure. As a result, this finite element model can be analyzed with conventional FEA techniques to provide an accurate computation of the component's natural frequencies.

While the present invention is described in connection with the modeling and design of an engine bracket, it is well suited for use in modeling and designing virtually any interfacing component. For example, the present method can be used to model and design a component that mounts to more than one interface structure or has multiple mounting locations on various planes. Further, the present invention is not limited for use in solid mechanics. The present invention can be used in virtually any application where boundary conditions can be emulated through the use of one or more shims.

The present invention is particularly useful in a customer/supplier context where the customer obtains an outside supplier to design and manufacturing component parts of an assembly. Referring to the preferred embodiment described above, the present invention is particularly useful in the automotive industry where an automotive company obtains the services of an outside supplier to design and manufacture components to be attached to an engine. In this context, the present invention can be used to allow suppliers to generate a finite element simulation of the characteristics of the engine, and more specifically the characteristics of the engine mounting bosses which will support the component.

In certain cases, the customer may wish to have some level of control over how much information is disclosed to its suppliers. Many finite element analysis software packages include a feature which makes it possible to pre-model the finite element test bar in a way that allows the structure of the test bar to remain hidden during finite element analysis of the finite element shim and finite element component. In many software packages, the pre-modeled representation is referred to as a "super element." This feature allows a customer to provide its suppliers with a super element representing the finite element test bar that can be used to perform the necessary finite element analysis. Because the structure of the finite element test bar is not readily available from the super element, the customer is able to limit the amount of information that is readily available to the supplier. The method for creating a super element varies from software application to software application and is readily understood by those of ordinary skill in the field.

Similarly, it is possible to model the steps of the finite element analysis process in a "macro." This allows a customer to provide its suppliers with a macro to conduct the required finite element analysis without disclosing what steps are involved in the process. Again, this provides the customer with some control over how much information is readily available to its suppliers. For example, the customer can create a macro which instructs the analysis software to (a) attach the finite element test bar, or a super element representing the finite element test bar, to the finite element shim; (b) compute the natural frequencies of the finite element test bar attached to the finite element shim; and (c) display the computed natural frequencies. As with super elements, the method for creating a macro varies from software application to software application and is readily understood by those of ordinary skill in the field.

Further, in some applications, the customer can retain some control over the process by predetermining the appropriate shim modulus(es) for each mounting location and then providing its suppliers with the shim modulus characteristics for each mounting location. Alternatively, the customer can create super elements representing the finite elements shims at each mounting location. The super elements can then be provided to suppliers on a "need to know" basis. The suppliers can then simply interpose the appropriate super element shims between the finite element component and ground and at each mounting location. The finite element model can then be analyzed with conventional FEA techniques to provide an accurate computation of the component's natural frequencies.

The present invention can also be used to test the quality of welds and other component connections. To use the test bar in this capacity, the standard test bar can be attached to a welded or otherwise attached component and the natural frequencies of the test bar can be measured. The measured natural frequencies can be compared to the natural frequencies expected in the case of a high quality weld. If the measured natural frequencies vary from the expected values, the weld can be rejected or flagged for further testing. In this application, the standard test bar can be secured to the component to be tested using a variety of conventional techniques such as high energy magnets, clamps, and contact adhesives, such as "Super Glue." In situations where the two interconnected components are relatively small, it may be necessary to secure the non-measured component during the testing. For example, the non-measured component can be clamped in a vise or otherwise secured to a structure having the approximate rigidity characteristics of a bed plate.

The above description is that of a preferred embodiment of the invention. Various alterations and changes can be made without departing from the spirit and broader aspects of the invention as defined in the appended claims, which are to be interpreted in accordance with the principles of patent law including the doctrine of equivalents.

The embodiments of the invention in which an exclusive property or privilege is claimed are defined as follows:

1. A method for generating a finite element model, comprising the steps of:

measuring a characteristic of a standard test bar mounted to an interface structure in first and second orientations;

generating a finite element model having a finite element shim interposed between a finite element test bar and a ground, wherein the finite element shim includes a separate modulus of elasticity in first and second directions corresponding to the first and second orientations;

selecting the moduli of elasticity of the shim such that a calculated characteristic of the finite element test bar correlates with the measured characteristic of the standard test bar in each orientation; and generating a finite element model having a finite element shim with the selected moduli of elasticity interposed between a component and a ground.

2. The method of claim 1 wherein said measuring step is further defined as measuring a natural frequency of the standard test bar in the first and second orientations; and said selecting step is further defined as selecting the moduli of elasticity of the shim such that a calculated natural frequency of the finite element test bar in each orientation correlates with the measured natural frequency of the standard test bar in that orientation.

3. The method of claim 2 further comprising the step of calibrating the finite element test bar to correlate with the standard test bar.

4. The method of claim 3 wherein said calibrating step includes the steps of:

measuring a natural frequency of the standard test bar mounted to a bed plate;

generating a finite element model of a finite element test bar fixed to ground; and selecting the characteristics of the finite element test bar so that a calculated natural frequency of the finite element test bar correlates with the measured natural frequency of the standard test bar.

5. The method of claim 4 wherein said selecting step of said calibrating step includes selecting at least one of a modulus of elasticity and a density of the finite element test bar.

6. The method of claim 5 wherein the standard test bar is attached to the interface structure with a fastener tightened to a predefined torque.

7. A method for generating a finite element model of a component adapted to interface with an interface structure, comprising the steps of:

generating a finite element component;

generating a finite element shim having a modulus of elasticity and a shape;

interposing the finite element shim between the finite element component and a ground;

selecting the modulus of elasticity of the finite element shim to provide the finite element component with a natural frequency corresponding to a natural frequency of the component when interfaced with the structure; and selecting the shape of the shim to account for variations in the directional stiffness of the component.

8. The method claim 7 wherein said modulus selecting step include the following steps:

providing a standard test bar;

mounting the standard test bar to the interface structure in a first orientation;

determining a natural frequency of the standard test bar attached to the interface structure in the first orientation;

mounting the standard test bar to the interface structure in a second orientation;

determining a natural frequency of the standard test bar attached to the interface structure in the second orientation;

selecting the modulus of elasticity of the finite element shim as a function of at least one of the determined natural frequencies of the standard test bar attached to the interface structure.

9. The method of claim 8 further comprising the step of calibrating the standard test bar to correlate with a finite element test bar.

10. The method of claim 9 wherein said calibrating step includes the steps of:

measuring a natural frequency of the standard test bar mounted to a bed plate;

generating a finite element model of the finite element test bar fixed to ground; and selecting the characteristics of the finite element test bar so that a calculated natural frequency of the finite element test bar correlates with the measured natural frequency of the standard test bar.

11. The method of claim 10 wherein said selecting step of said calibrating step includes selecting at least one of a modulus of elasticity and a density of the finite element test bar.

12. The method of claim 11 wherein the standard test bar is attached to the interface structure with a fastener tightened to a predefined torque.

13. A method for determining the apparent rigidity of an interface structure at a mounting location, comprising the steps of:

providing a standard test bar having a natural frequency when attached to a bed plate;

mounting the standard test bar to the interface structure at the mounting location in a first orientation;

determining a natural frequency of the standard test bar mounted to the interface structure in the first orientation;

mounting the standard test bar to the interface structure at the mounting location in a second orientation;

determining a natural frequency of the standard test bar mounted to the interface structure in the second orientation;

comparing the natural frequency of the standard test bar when attached to the bed plate with the natural frequencies of the standard test bar when attached to the interface structure in both first and second orientations to determine the apparent rigidity of the interface structure with respect to the bed plate.

14. The method of claim 13 wherein the standard test bar is attached to the interface structure with a fastener tightened to a predefined torque.

15. A method for designing a component to interface with an interface structure, comprising the steps of:

providing a standard test bar;

mounting the standard test bar to the interface structure by a fastener tightened to a predefined torque;

measuring a natural frequency of the test bar mounted to the interface structure;

generating, in a computer, a finite element model having a finite element representation of a shim interposed between a finite element representation of the component and a finite element ground;

selecting the modulus of elasticity of the finite element representation of a shim as a function of the measured natural frequency of the test bar mounted to the interface structure; and performing, in a computer, finite element analysis of the finite element model.

16. The method of claim 15 wherein said selecting step includes the steps of:

generating, in a computer, a finite element model having a finite element representation of a shim interposed between a finite element representation of the standard test bar and a finite element ground;

computing, in the computer, a natural frequency of the finite element representation of the standard test bar;

comparing the computed natural frequency with the measured natural frequency of the test bar mounted to the interface structure; and adjusting the modulus of elasticity of the shim and recomputing, in a computer, the natural frequency of the finite element representation of the standard test bar until the computed natural frequency corresponds with the measured natural frequency.

17. The method of claim 16 further comprising the steps of calibrating the standard test bar with the finite element representation of standard test bar.

18. The method of claim 17 wherein said calibrating step includes the steps of:

mounting the standard test bar to a bed plate;

measuring a natural frequency of the standard test bar mounted to a bed plate;

generating, in a computer, a finite element model having a finite element representation of the standard test bar fixed directly to a finite element ground; and selecting the characteristics of the finite element representation of the standard test bar such that a computed natural frequency of the finite element representation of the standard test bar fixed directly to ground correlates with the measured natural frequency of the standard test bar mounted to the bed plate.

19. The method of claim 18 wherein said selecting step of said calibrating step includes selecting at least one of a modulus of elasticity and a density of the finite element representation of the standard test bar.

20. The method of claim 19 wherein said providing step includes selecting the geometry of the standard test bar such that a first natural frequency of the standard test bar is easily discernible using conventional physical techniques when the standard test bar is attached to the bed plate.

21. The method of claim 20 wherein said selecting step of said providing step includes providing the standard test bar with a neck portion having an axis and a vertical portion extending parallel to the axis of the neck portion.

22. A method for generating a finite element model, comprising the steps of:

measuring a natural frequency of a standard test bar mounted to an interface structure in a first orientation;

measuring a natural frequency of a standard test bar mounted to an interface structure in a second orientation; and generating a finite element model having a finite element shim interposed between a finite element component and a ground, wherein the characteristics of the finite element shim are selected to simulate stiffness of the interface structure in both the first and second orientations.

23. The method of claim 22 wherein the characteristics of the finite element shim include a modulus of elasticity in a first direction corresponding to the first orientation of the standard test bar and a modulus of elasticity in a second direction corresponding to the second orientation of the standard test bar;

said generating step including selecting the modulus of elasticity in the first direction to correspond with the measured natural frequency of the standard test bar in the first orientation and selecting the modulus of elasticity in the second direction to correspond with the measured natural frequency of the standard test bar in the second orientation.

24. The method of claim 22 wherein the characteristics of the finite element shim include a modulus of elasticity and a shape;

said generating step including selecting the shape and modulus of elasticity of the finite element shim such that the finite element shim simulates the stiffness of the interface structure in both the first and second orientations.

25. A method for testing the quality of a connection between two components, comprising the steps of:

providing a standard test bar having an expected natural frequency;

mounting the standard test bar to one of the two interconnected components;

determining a natural frequency of the standard test bar mounted to the one component; and comparing the determined natural frequency of the standard test bar to the expected natural frequency of the standard test bar to determine the quality of the connection.

26. The method of claim 25 wherein the expected natural frequency is further defined as the expected natural frequency when the standard test bar is mounted to a bed plate.

27. The method of claim 25 wherein the expected natural frequency is further defined as the expected natural frequency when the standard test bar is mounted directly to the non-measured component.

28. A method for generating a finite element model in a computer, comprising the steps of:

determining the rigidity of an interface structure; and generating in a computer a finite element model having a finite element shim interposed between a finite element component and a ground, wherein the characteristics of the finite element shim are selected to simulate the rigidity of the interface structure.

29. The method of claim 28 wherein said measuring step is further defined as measuring the rigidity of the interface structure along a first direction;

further comprising the step of measuring the rigidity of the interface structure along a second direction; and wherein said generating step includes generating the finite element shim with characteristics that simulate the rigidity of the interface structure in the first direction and the second direction.

30. The method of claim 28 wherein said generating step includes selecting the modulus of elasticity of the finite element shim in a first direction to correspond with the measured rigidity of the interface structure along the first direction and selecting the modulus of elasticity of the finite element shim in a second direction to correspond with the measured rigidity of the interface structure along the second direction.

* * * * *